Dec. 6, 1960

G. D. BRUCE ET AL 2,963,594

TRANSISTOR CIRCUITS

Original Filed Sept. 30, 1954

BY

INVENTORS
GEORGE D. BRUCE
ROBERT A. HENLE
JAMES L. WALSH

Lester H. Clark
ATTORNEY

United States Patent Office 2,963,594

Patented Dec. 6, 1960

2,963,594

TRANSISTOR CIRCUITS

George D. Bruce, Poughkeepsie, and Robert A. Henle and James L. Walsh, Hyde Park, N.Y., assignors to International Business Machines Corporation, New York, N.Y., a corporation of New York Original application Sept. 30, 1954, Ser. No. 459,382, now Patent No. 2,888,578, dated May 26, 1959. Divided and this application Jan. 19, 1959, Ser. No. 787,678

3 Claims. (Cl. 307—88.5)

This is a division of our copending application Serial No. 459,382, filed September 30, 1954, now Patent No. 2,888,578, issued May 26, 1959.

The present invention relates to transistor logic circuits, and especially to logic circuits which also function as impedance matching circuits.

Logic circuits may be defined as circuits having a plurality of sets of input terminals and a single set of output terminals, which produce a signal at the output terminals only in response to the existence of a predetermined combination of signals at the input terminals. Typically, a logic circuit may be an AND or an OR circuit. An AND circuit produces an output signal when signals are received simultaneously at all the input terminals, while an OR circuit produces an output signal in response to an input signal at any one of its sets of input terminals.

It sometimes is desirable to have a logic circuit respond to input signals from sources whose impedances differ one from another, or whose impedances differ substantially from the input impedances of the circuit to which the output signals are to be directed. This is conventionally accomplished by using impedance matching circuits between the sources and loads whose impedances differ.

An object of the present invention is to provide logic circuits by which such signal sources and signal utilizing devices having different impedances may be connected together, so that one circuit performs both the logic function and the impedance matching function.

The foregoing and other objects of the invention are attained in the circuit described herein, which is an emitter follower circuit, including a PNP junction transistor having a high impedance signal generator connected in series with its base through a resistor. The emitter is strongly positively biased by means of a battery and a resistor. The collector is connected to a negative bias source of electrical energy. The positive bias on the emitter is sufficiently strong so that the transistor conducts continuously. When a positive signal is received at the base input, the base potential is shifted in the positive direction, and since the emitter to base impedance is very low, the emitter potential is similarly shifted. A second input circuit, including a low impedance signal generator, is connected in series with a diode between the emitter and ground. A low impedance load is connected across output terminals at the emitter and ground.

Other objects and advantages of the invention will become apparent from a consideration of the following specification and claims, taken together with the accompanying drawing.

Figure 1:
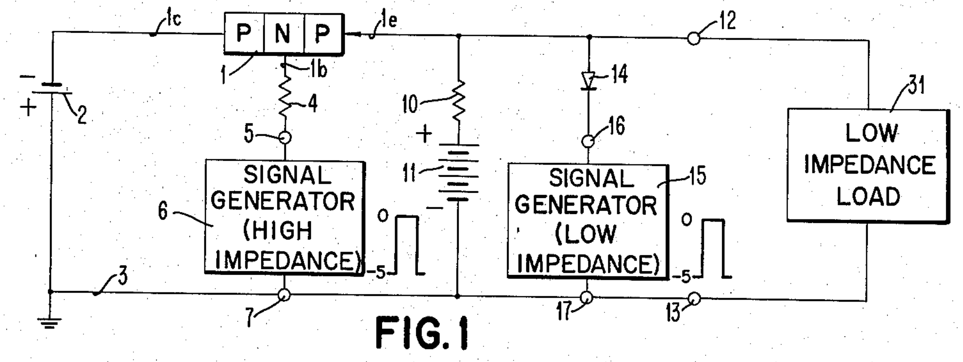
Fig. 1 is a wiring diagram of a logic circuit, embodying the invention.

*Figure 1*

The AND circuit shown in this figure includes a PNP junction transistor 1 having an emitter electrode **1*e*, a base electrode 1*b*, and a collector electrode 1*c*. Collector 1*c* is connected through a biasing battery 2 to a grounded wire 3. Base electrode 1*b* is connected through a resistor 4 to an input terminal 5. A signal generator 6 is connected between the input terminal 5 and a grounded input terminal 7. The signal generator 6 may be of any suitable construction and by way of example is indicated as being shiftable between a "no signal" condition wherein terminal 5 is at a potential of minus 5 volts with respect to terminal 7, and a "signal" condition wherein the input terminals 5 and 7** are at the same potential.

The emitter **1*e* is connected in series with a resistor 10 and an emitter current supply battery 11, whose opposite terminal is grounded. Output terminals 12 and 13 are connected respectively to the emitter 1*e* and to ground. A second input circuit is connected between the emitter 1*e* and ground, and comprises a diode 14 and a signal generator 15 which must be a low impedance generator as compared to the high impedance signal generator 6, but whose "no signal" and "signal" terminal potentials are the same as those of generator 6, i.e., —5 and 0 volts respectively. A low impedance load 31 is connected between output terminals 12 and 13**.

*Operation of Figure 1*

When no signal is received from either of the generators 6 and 15, i.e., with both the input signals at their most negative value, current flows continuously from the battery 11 through resistor 10, emitter **1*e*, base 1*b*, resistor 4 and signal generator 6 back to the negative terminal at battery 11. Current also flows from emitter 1*e* through collector 1*c* and thence through battery 2** to ground.

Under the conditions just described, the base **1*b* and the emitter 1*e* are both substantially at the same potential, although, as stated, the emitter is slightly more positive than the base. Both the emitter and the base are positive with respect to the collector. Substantially all the potential drop in the emitter-base circuit takes place through the resistors 10 and 4. The output terminal 12 remains at a negative potential only slightly more positive than minus 5 volts. If a positive signal is received from generator 6 only, the potential of base electrode 1*b* tends to go to 0 volts and the potential of emitter 1*e* tends to follow. However, diode 14 and the potential of generator 15 form an effective clamp circuit which may be traced from the positive terminal of battery 11 through resistor 10, diode 14 in its low impedance direction, signal generator 15 and the grounded wire 3. The potential of signal generator 15 is then the same as the OFF potential of signal generator 6, i.e., minus 5 volts, so that output terminal 12 remains at minus 5 volts. Emitter 1*e*** is also at minus 5 volts, so the transistor is cut off.

If a signal appears at the terminals of generator 15, while there is no signal at the generator 6, then the potential at emitter **1*e* is lower than that at terminal 16, and the diode 14 is poled to block any flow of current from the generator 15 toward emitter 1*e* and terminal 12. The conditions at output terminal 12 therefore remain the same as though no signal were received from generator 15**.

When signals are received from generators 6 and 15 simultaneously, the potential of emitter electrode **1*e* tends to go to 0 volt, which is substantially the same as the potential at input terminal 16 (0 volt) and there is then essentially no potential drop across the diode 14**.

This shift in the potential of terminal 12 produces an output pulse at the terminals 12 and 13.

Summarizing, it may be seen that input signals at either generator 6 or generator 15 separately produce no output pulse, but that signals at both generators 6 and 15 simultaneously produce an output pulse. This is typical AND circuit operation.

The circuit of Fig. 1 permits interconnection of a high impedance signal source 6 with a low impedance source 15 and a load 31.

Figure 2:
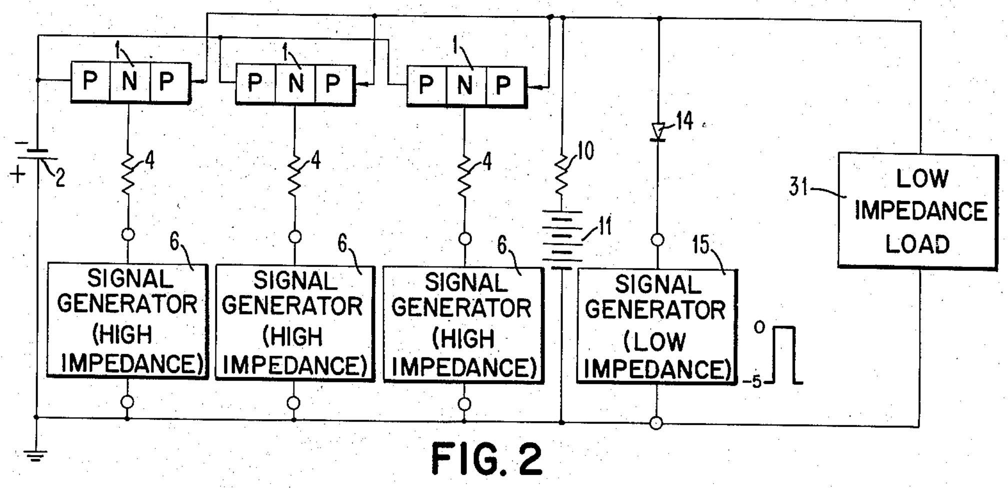
Figs. 2 and 3 are wiring diagrams of modifications of the circuit of Fig. 1.
Figure 3:
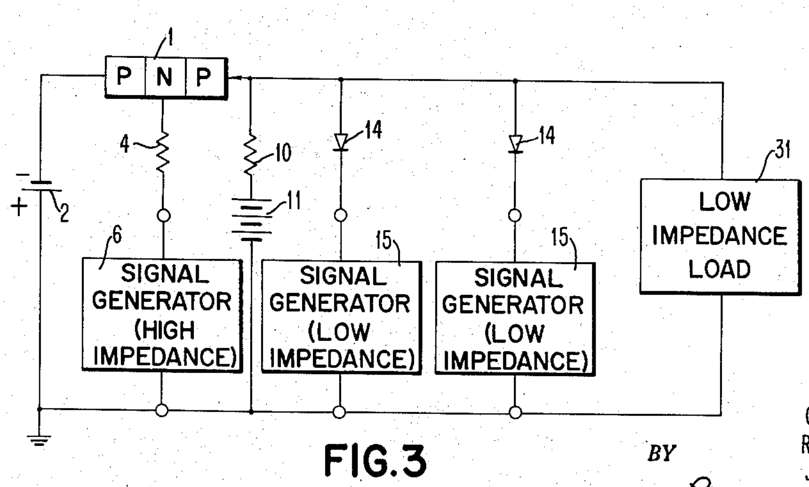

*Figs. 2 and 3*

While the circuit of Fig. 1 is shown with only two inputs, it will readily be understood that the circuit may be expanded to include more than two inputs. Such an expansion might take the form of additional transistors connected in parallel with transistor 1, and each with a separate base input, as shown in Fig. 2, or alternatively it might take the form of additional diodes and inputs connected in parallel with diode 14, as shown in Fig. 3, or both alternatives might be employed. The particular alternative selected will of course depend upon the number of high impedance signal sources (requiring transistor inputs) involved and the number of low impedance sources (requiring diode inputs).

The following table shows by way of example particular values for the potentials of the various batteries and for the impedances of the various resistors and capacitors in circuits which have been operated successfully. These values are set forth by way of example only and the invention is not limited to them nor to any of them. The diode may be assumed to have substantially no impedance in its forward direction and substantially infinite impedance in its reverse direction. The high impedance signal generators may have impedances in the range of 20,000–50,000 ohms. The low impedance signal generators may have impedances of the order of 10 ohms. The load 31 may be of the order of 500 ohms.

TABLE I

| | | |
|---|---|---|
| Battery **2** | volts | 8 |
| Resistor **4** | ohms | 1K |
| Resistor **10** | do | 3.9K |
| Battery **11** | volts | 15 |

While we have shown and described certain preferred embodiments of our invention, other modifications thereof will readily occur to those skilled in the art, and we therefore intend our invention to be limited only by the appended claims.

What is claimed is:

1. A logic circuit comprising at least one high impedance signal input means, one transistor for each high impedance signal input means, each transistor having base, emitter, and collector, a resistor for each transistor, means connecting the high impedance signal input means and the resistor in series between the base electrode of its associated transistor and a common junction, a source of biasing potential, means connecting said source between the collector electrode and the common junction with said source poled to bias the collector reversely with respect to the base, a common source of direct electrical energy, a common resistor, means connecting the common source and the common resistor in series between the emitter electrodes of all the transistors and the common junction, with the common source poled to bias the emitters forwardly with respect to the base, at least one low impedance signal input means, one diode for each low impedance signal input means, means connecting each low impedance signal input means in series with its associated diode between the emitter electrodes and the common junction, with the diode poled forwardly to current from the common source, and a pair of output terminals connected respectively to said emitters and to the common junction.

2. A logic circuit as defined in claim 1, including a low impedance load connected between the output terminals.

3. An AND circuit comprising a relatively low impedance signal input means, a relatively high impedance signal input means, an output terminal, a source of direct electrical energy, a resistor, means connecting the energy source and the resistor in series between the output terminal and a common junction, a diode, first circuit means connecting the low impedance signal input means and the diode in series between the output terminal and the common junction with the diode nearest the output terminal and poled forwardly with respect to current from the energy source, a transistor having an emitter, a base, and a collector, second circuit means connecting the high impedance signal input means and the emitter-base impedance of the diode in series between the output terminal and the common junction with the emitter-base impedance nearest the output terminal and poled forwardly with respect to current from the energy source, and means supplying a bias potential for the collector, each said signal input means being shiftable between a no-signal potential at which it is relatively ineffective to oppose current flow from the energy source, and a substantially separated signal potential at which it is relatively effective to oppose current flow from the energy source, each signal input means when at its no-signal potential cooperating with its associated circuit means to clamp the output terminal substantially at said no-signal potential, said signal input means cooperating when both are at said signal potential to shift said output terminal substantially to said signal potential.

References Cited in the file of this patent

UNITED STATES PATENTS

| | | |
|---|---|---|
| 2,705,287 | Lo | Mar. 29, 1955 |
| 2,879,412 | Hoge et al. | Mar. 24, 1959 |

FOREIGN PATENTS

| | | |
|---|---|---|
| 1,119,708 | France | Apr. 9, 1956 |